United States Patent

Rodder et al.

Patent Number: 6,063,677
Date of Patent: May 16, 2000

[54] METHOD OF FORMING A MOSFET USING A DISPOSABLE GATE AND RAISED SOURCE AND DRAIN

[75] Inventors: Mark S. Rodder, University Park; Richard A. Chapman, Dallas, both of Tex.

[73] Assignee: Texas Instruments Incorporated, Dallas, Tex.

[21] Appl. No.: 08/957,503

[22] Filed: Oct. 24, 1997

Related U.S. Application Data

[60] Provisional application No. 60/029,215, Oct. 28, 1996.

[51] Int. Cl.[7] .................. H01L 21/336; H01L 21/4763
[52] U.S. Cl. .................. 438/300; 438/301; 438/303; 438/592
[58] Field of Search .................. 438/300, 301, 438/303, 592

[56] References Cited

U.S. PATENT DOCUMENTS

| | | |
|---|---|---|
| 5,168,072 | 12/1992 | Moslehi . |
| 5,391,510 | 2/1995 | Hsu et al. . |
| 5,545,579 | 8/1996 | Liang et al. . |
| 5,576,227 | 11/1996 | Hsu . |
| 5,824,586 | 10/1998 | Wollesen et al. . |
| 5,900,666 | 5/1999 | Gardner et al. . |

OTHER PUBLICATIONS

Han et al.; "Recent developments in N20/NO–based ultra thin oxynitride gate dielectrics for CMOS ULSI applications", Solid–State and Integrated Circuit Technology, 1995; pp. 80–84, Nov. 1995.

*Primary Examiner*—Richard Booth
*Assistant Examiner*—Ron Pompey
*Attorney, Agent, or Firm*—Jacqueline J. Garner; Wade James Brady; Frederick J. Telecky, Jr.

[57] ABSTRACT

A method for forming a MOSFET transistor (100) using a disposable gate (120). A disposable gate (120) having at least two materials (122,124) that may be etched selectively with respect to each other is formed on a semiconductor substrate (102). Source/drain regions (104) are then formed adjacent the disposable gate. The source/drain regions may, for example, include raised source/drain regions (106). An insulator layer (114) is then deposited over the structure and then a portion of the insulator layer (114) over the disposable gate (120) is removed (e.g., using CMP or an etch-back). The composition of the insulator layer (114) is chosen such that the top layer (124) of the disposable gate (120) may be removed selectively with respect to the insulator layer (114). The disposable gate (120) is then removed and a channel implant may be performed that is self-aligned and only in the channel region. The gate dielectric (110) and gate electrode (112) are then formed.

32 Claims, 2 Drawing Sheets

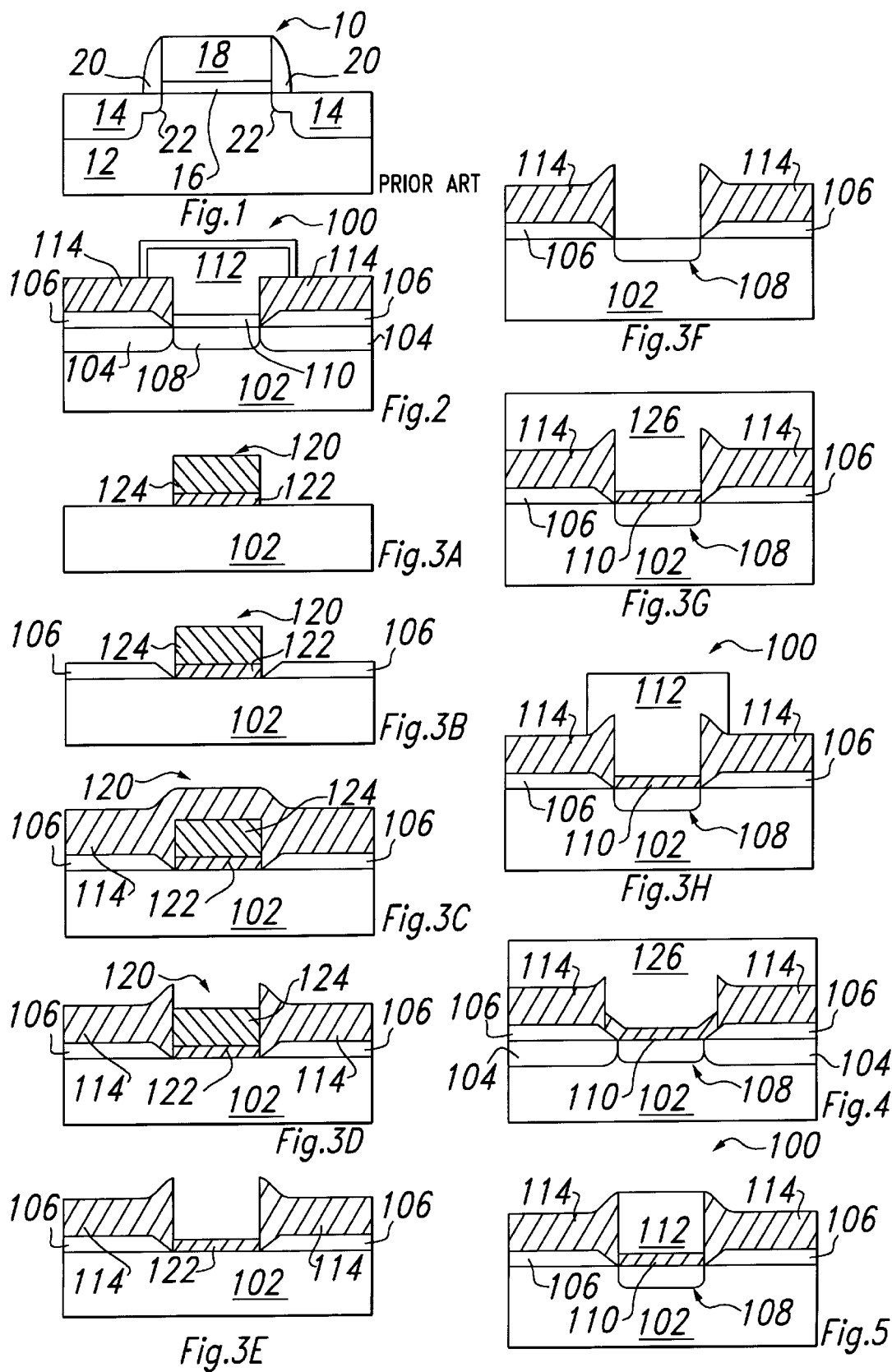

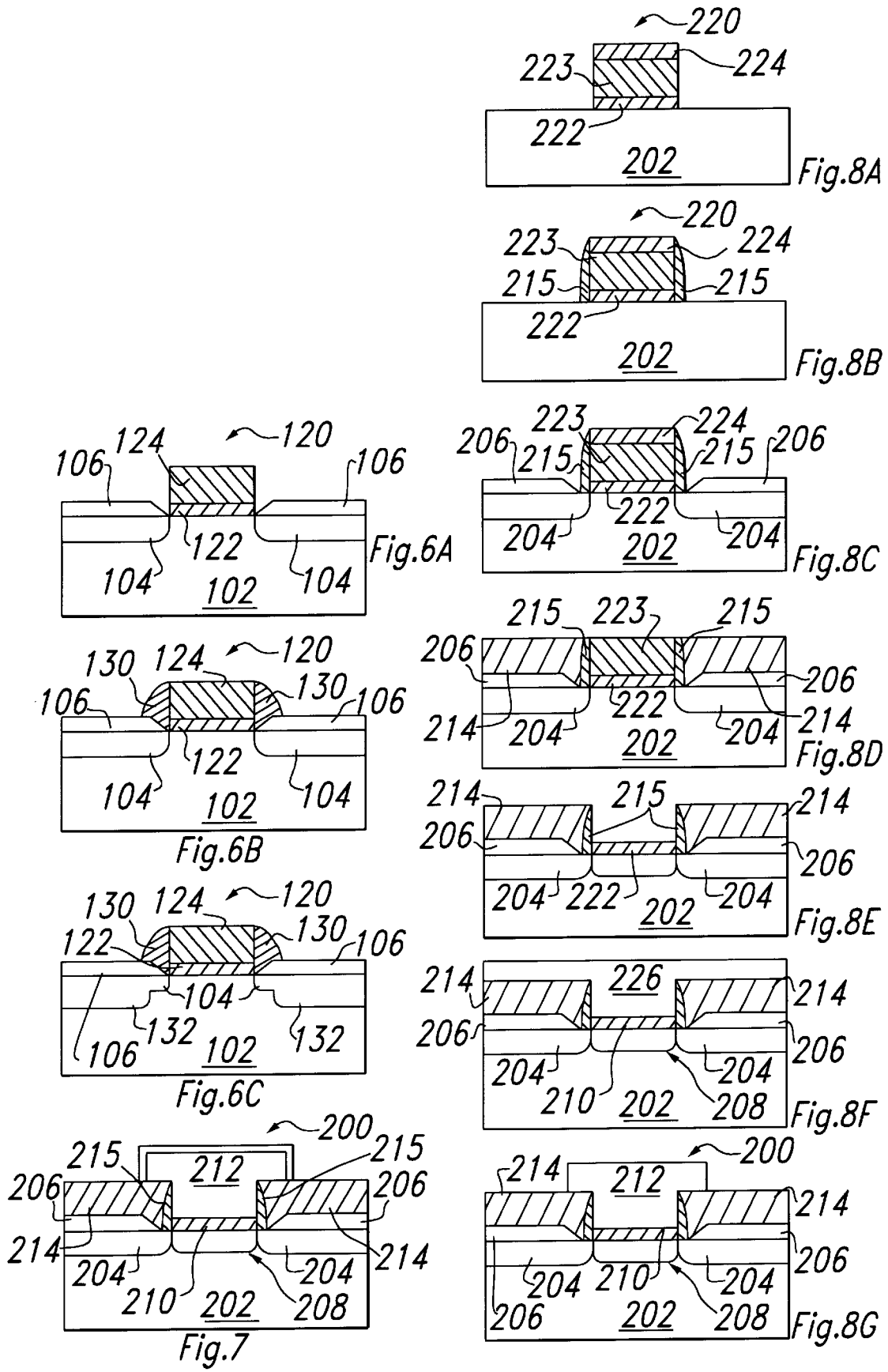

METHOD OF FORMING A MOSFET USING A DISPOSABLE GATE AND RAISED SOURCE AND DRAIN

CROSS-REFERENCE TO RELATED APPLICATION

This application claims priority under 35 USC §119 (e)(1) of provisional application Ser. No. 60/029,215, filed Oct. 28, 1996.

| Ser. No.   | Filed | Inventors    |
| ---------- | ----- | ------------ |
| (TI-22748) |       | Rodder et al.|

FIELD OF THE INVENTION

This invention generally relates to semiconductor processes and more specifically to forming a MOSFET structure using a disposable gate process.

BACKGROUND OF THE INVENTION

As CMOS technology continues to scale further into the sub-micron region, it becomes increasingly difficult to keep sufficiently low gate sheet resistance, low junction capacitance, and low junction depth of source/drain extensions under the gate. A conventional CMOS transistor 10 is shown in FIG. 1. Source/drain regions 14 are formed in a substrate 12. The polysilicon gate electrode 18 is separated from the substrate 12 by gate oxide layer 16. Sidewall dielectrics 20 are formed on the sidewalls of gate electrode 18. Transistor 10 typically includes source/drain extensions 22 that extend under sidewall dielectric 20.

As transistor 10 is scaled into the deep sub-micron region, the polysilicon gate 18 linewidths become narrower and narrower. This increases the gate sheet resistance. Achieving low gate sheet resistance becomes difficult even when silicided polysilicon is used. The source/drain junction regions 14 and source/drain extensions 22 must also become shallower to avoid undesired short-channel effects and roll-off of the threshold voltage at short channel lengths. However, in the deep sub-micron region, it is difficult to achieve shallower doping profiles by conventional means such as ion implantation. Therefore, there is a need for a CMOS transistor structure that can be scaled further into the sub-micron region while maintaining sufficiently low gate sheet resistance, small junction depth, and low junction capacitance.

BRIEF DESCRIPTION OF THE DRAWINGS

In the drawings:

FIG. 1 is a cross-sectional diagram of a prior art MOSFET structure;

FIG. 2 is a cross-sectional diagram of a MOSFET forming according to a first embodiment of the invention;

FIGS. 3A–H are cross-sectional diagrams of the MOSFET of FIG. 2 during various stages of fabrication;

FIG. 4 is a cross-sectional diagram of an alternative embodiment for the MOSFET of FIG. 2 during fabrication;

FIG. 5 is a cross-sectional diagram of an alternative embodiment for the MOSFET of FIG. 2 during fabrication;

FIGS. 6A–6C are cross-sectional diagrams of an alternative embodiment for the MOSFET of FIG. 2 during fabrication;

FIG. 7 is a cross-sectional diagram of a MOSFET formed according to a second embodiment of the invention;

FIGS. 8A–G are cross-sectional diagrams of the MOSFET of FIG. 4 during various stages of fabrication.

Corresponding numerals and symbols in the different figures refer to corresponding parts unless otherwise indicated.

DETAILED DESCRIPTION OF PREFERRED EMBODIMENTS

The invention will now be described in conjunction with a raised source/drain MOSFET for the deep submicron regime (i.e., tenth-micron and below). Those of ordinary skill in the art will realize that the benefits of the invention are also applicable to other MOSFET structures and that the benefits are not limited to the deep sub-micron regime.

A raised source/drain MOSFET 100 formed according to a first embodiment of the invention is shown in FIG. 2. MOSFET 100 is formed in substrate 102 and comprises ultra-shallow source/drain junction regions 104 below raised source/drain regions 106. Raised source/drain regions 106 are, for example, doped epitaxial silicon. However, other materials such as other semiconductors, metals, or silicides may alternatively be used. Channel doping is substantially limited by means of self-alignment to the immediate channel region 108. This reduces the source/drain junction capacitance over the traditional methods of (a) implanting the entire active area for the channel implant including the source/drain junction regions, or (b) using non-self-aligned but more localized channel implant.

A gate dielectric 110 separates the gate electrode 112 from the channel region 108 and raised source/drain regions 106. Gate dielectric 110 may comprise any appropriate material. Conventionally, a thermally grown oxide, oxynitride, or deposited gate insulator is used. Gate electrode 112 preferably comprises a low resistance material such as metal or doped polysilicon. However, other conductive materials, such as amorphous silicon, a non-crystalline silicon, a composite metal-polysilicon or metal-metal, may alternatively be used. Examples include aluminum over titanium-nitride and tungsten over titanium nitride. Gate electrode 112 is also preferably salicided to further reduce sheet resistance if polysilicon is used. If desired, gate electrode 112 may be formed into a T-gate structure as shown in FIG. 2. A T-gate structure is not required to practice the invention, but offers further reduction in gate sheet resistance.

An insulator layer 114 separates the raised source/drain regions 106 from the overlying portions of the T-gate structure 112. The material of insulator layer 114 is chosen such that a disposable gate material used during processing may be etched selectively with respect to dielectric layer 114. This will be described further below. For example, insulator layer 114 may comprise an oxide. The thickness of insulator layer 114 may be tailored to allow for a low gate-to-drain capacitance between the raised source/drain regions 106 and the overlying portion of the T-gate structure 112.

A method for forming MOSFET 100 according to the first embodiment of the invention will now be described in conjunction with FIGS. 3A–3H. Referring to FIG. 3A, a disposable gate 120 is formed on an active area of substrate 102 over the region where the channel region of MOSFET 100 is desired. In the preferred embodiment, disposable gate 120 comprises two materials, first material 122 and second material 124. The first and second materials 122 and 124 are chosen so that they may be selectively etched with respect to each other. For example, they may comprise oxide and nitride respectively. The first material is also chosen so that it may be etched very selectively with respect to silicon to avoid damaging the channel region upon its removal.

Next, raised source/drain regions 106 may be formed. The source/drain regions 104 and/or 106 may be formed in various ways. One preferred method will now be discussed and alternative methods will be discussed further herein below. Raised source/drain regions 106 may comprise materials such as semiconductors, metals, silicides, or combinations thereof. In this exemplary embodiment, an epitaxial or amorphous layer of, for example, silicon is selectively formed over substrate 102 adjacent disposable gate 120, as shown in FIG. 3B. Disposable gate 120 is used as a masking layer for the epitaxial process. Thus, raised source/drain regions 106 are self-aligned to disposable gate 120. Angled faceting of an epitaxially formed raised source/drain region 106 at the edge of the disposable gate 120 may occur. The degree of faceting may be partially controlled by adjusting process parameters of the cleaning and deposition processes.

Raised source/drain regions 106 are doped with an appropriate dopant. If silicon material is used for the raised source/drain regions 106, a n-type dopant, such as phosphorous and/or arsenic or antimony, is used for a n-channel MOSFET and a p-type dopant, such as boron, is used for a p-channel MOSFET. Preferably, raised source/drain regions 106 are doped in situ by appropriate means of deposition and masking, but they may alternatively be doped after deposition by means such as implant if the raised source/drain regions 106 comprise a material such as silicon, metal, or salicide.

If desired, a selected portion of the raised source/drain regions 106 may be cladded after their formation. The cladding forms a low resistance material over the raised source/drain regions by means of e.g., salicidation or formation of a metal layer over a portion of the raised source/drain regions 106. Cladding prior to the formation of the gate dielectric and gate electrode reduces the heat treatments seen by the gate dielectric and gate electrode.

Referring to FIG. 3C, a insulator material 114 is deposited over the structure. Insulator material 114 is chosen such that it may be etched selectively with respect to the second material 124 of disposable electrode 120. For example, if the second material 124 is nitride, insulator material 114 may comprise an oxide. Insulator material 114 is then removed to expose disposable gate 120, as shown in FIG. 3D. For example, an etch-back process or chemical-mechanical polishing (CMP) may be used. Alternatively, a patterned etch of insulator material 114 in the proximity of the disposable gate 120 may be used. Insulator layer 114 covers raised source/drain regions 106, but not the surface of disposable gate 120.

Next, the second material 124 of disposable gate 120 is selectively removed, as shown in FIG. 3E. Because the composition of first material 122, second material 124 and insulator material 114 are chosen such that second material 124 may be selectively etched with respect to both insulator material 114 and first material 122, insulator layer 114 and first material 122 are not appreciably removed during the removal of second material 124. After the removal of second material 124, first material 122 is removed. Again, due to the judicious choice of materials and/or etch processes, first material 122 is removed without etching into the substrate 102. Severe damage to the channel region 108 of substrate 102 is thereby avoided.

Referring to FIG. 3F, introduction of channel dopants (e.g., by means such as a channel (or Vt) implant or gas immersion laser doping) is performed either before or after the removal of first material 122. Because insulator layer 114 covers raised source/drain regions 106, the introduction of channel dopants is substantially limited to only the immediate channel 108 area. The introduction of channel dopants is self-aligned to the raised source/drain regions 106. This prevents an increase in the capacitance of the subsequently formed source/drain junction region over prior art methods in which the channel implant is not self-aligned to the channel but extends into the source/drain junction regions as well.

Next, a gate dielectric 110 is formed followed by the deposition of gate material 126, as shown in FIG. 3G. Gate dielectric 110 may comprise a grown and/or deposited oxide, oxynitride, or any other suitable gate dielectric material including materials with higher dielectric constant than silicon dioxide. If gate dielectric 110 is deposited, then it may be nearly conformal along the vertical edges of insulator 114 as well as on top of insulator layer 114 (not shown). The lateral dimension of the gate material 126 adjacent to the gate dielectric 110 is determined by the opening in insulator material 114 left by the removal of the disposable gate 120. Thus, the actual channel length is not determined by the patterned etch of the gate material 126. The opening left by the removal of disposable gate 120 may be such that the gate dielectric 110 and gate material 126 do or do not extend directly over a portion of the raised source/drain regions 106 and/or doped source/drain regions 104. (Note: in this embodiment, regions 104 are not yet formed.) FIG. 3G shows the case where the gate dielectric 110/gate material 126 do not extend directly over regions 106 within the space left by the removal of the disposable gate 120. For the case where the gate dielectric 110/gate material 126 do extend over the facets of regions 106, the gate dielectric 110 in part separates the gate material 126 from the source/drain regions 106 and/or 104, as shown in FIG. 4. Extension of the gate material 126 over regions 106 and/or 104 may be beneficial in reducing series resistance of the subsequently formed MOSFET although an increase in gate-to-drain capacitance will additionally result. The existence and/or optimization of the extension of gate material 126 depends on the application and trade-offs between such issues as the before mentioned series resistance and overlap capacitance.

Gate material 126 may comprise a non-crystalline material substantially containing silicon or silicon-germanium, a doped polysilicon layer, a doped amorphous silicon layer, a metal layer, a composite material comprised of different metals or a combination of metal and semiconductor material, or other appropriate conductive materials (e.g., materials including tungsten, titanium nitride, aluminum, or copper). Additionally, it is noted that if a semiconductor material is utilized in part for the gate material 126, this semiconductor material can be doped in-situ or doped after deposition by means such as implantation and anneal. Doping can be by introduction of n-type dopants (e.g., phosphorus, arsenic or antimony) for an n-type gate material or by p-type dopants (e.g., boron) for a p-type gate material.

Gate material 126 may then be patterned and etched to form gate electrode 112, as shown in FIG. 3H. By performing the gate processing after source/drain formation, heat treatments required by source/drain formation do not affect the gate dielectric 110 and gate electrode 112. Thus, a doped polysilicon gate electrode can be used with an ultra-thin gate dielectric (i.e., 60 Å or even less than 30 Å) without having dopant diffuse from the doped polysilicon into the gate dielectric and channel region. Alternatively, a gate electrode comprising, in part, a metal can be used because the heat treatments for the source/drain formation have already been performed.

If desired, a T-gate structure in which the gate electrode extends over a portion of insulator layer 114 may be used to further reduce the gate sheet resistance, as shown in FIG. 3H. In addition, having insulator layer 114 separate the raised source/drain regions 106 from the overlying portions of T-gate structure 112 results in a low gate-to-drain capacitance between raised source/drain regions 106 and the overlying portions of T-gate structure 112. Although it offers some advantages, a T-gate structure is not required to practice the invention.

There are several methods that may be used to form gate electrode 112. As a first example, after deposition, the gate material 126 can be planarized back so that it is substantially even with insulator layer 114 to form a self-aligned non-T-gate structure, as shown in FIG. 5. Subsequently, if desired, a T-gate structure may be formed by means such as a selective epitaxy of semiconductor or metal with the epitaxial overgrowth resulting in a T-gate structure. As a second example, the deposited gate material 126 may simply be patterned and etched to form a T-gate structure extending over a portion of insulator layer 114. In addition, the gate electrode 112 may be cladded by a lower resistance material if desired. Cladding may be accomplished in a number of ways including salicidation, epitaxy of, for example, a metal, or deposition, pattern and etch of a low resistance material.

In a third example, after the gate material 126 is deposited, but before it is etched, a cladding material may be deposited. Then, the cladding material and gate material may be patterned and etched to form a T-gate structure electrode 112. In this case, both the gate material 126 and cladding material of electrode 112 extend over the insulating layer 114.

In a fourth example, a non-T-gate structure may be formed as described above. Subsequently, cladding may be accomplished by depositing a low resistance material (e.g. silicide or metal) and patterning and etching the cladding material such that it extends over a portion of insulator layer 114. In this case, the gate electrode 112 comprises a T-gate structure in which only the cladding layer extends over insulating layer 114.

Finally, the structure may be annealed at this point to diffuse dopant from the raised source/drain regions 106 to form source/drain junction regions 104 if such regions are desired. However, it should be noted that adequate diffusion can be obtained during the deposition of the raised source/drain if the deposition time or temperature is sufficient. The anneal may also be performed earlier in the process if desired or it may be part of another process such as the formation of a gate dielectric. Diffusing the dopant from a raised source/drain structure allows for shallower source/drain junction regions 104 than are possible with an implant doped source/drain junction region.

Subsequent the process flow described above, conventional processes may be used to form connections from the gate electrode 112 and source/drain regions 106 or 104 to other devices (not shown). Various modifications to the process described above will be apparent to persons skilled in the art upon reference to the description. Several modifications for forming source/drain regions for MOSFET 100 will now be discussed.

In a first modification, instead of epitaxially forming raised source/drain regions 106, the raised source/drain regions 106 may be formed by other methods. For example, they may be formed by a non-selective deposition of the desired conductive material followed by pattern and etch of this material. Exemplary materials include semiconductors, metals, silicides, or combinations thereof.

In second modification, source/drain regions 104 may not be substantially formed. That is, diffusion of dopant from the raised source/drain regions 106 may not be required or substantially required if the processes used to remove the disposable gate materials 122 and 124 are adjusted to remove a controlled small part of material 114. This, in turn, exposes a portion of raised source/drain regions 106 to the gate dielectric 110.

It should also be noted that source/drain regions 104 may be formed in other ways not requiring diffusion from raised source/drain regions 106. For example, regions 104 may be diffused from an overlying layer such a polysilicon-germanium or doped oxide, they may implant doped using a variety of techniques to keep the regions 104 shallow, or they may be formed using gas-immersion laser doping.

In a third modification, deep source/drain regions 132 are utilized. The raised source/drain regions 106 are annealed prior to removing the disposable gate 120 to form source/drain regions 104, as shown in FIG. 6a. A sidewall spacer 130 is formed on the sidewalls of disposable gate 120 over the facets of raised source/drain regions 106, as shown in FIG. 6b. After the formation of sidewall spacer 130, deeper source/drain region 132 are formed by, for example, means such as implantation and anneal, as shown in FIG. 6c. Sidewall spacers 130 serve to space the deeper source/drain regions 132 from the subsequently formed gate electrode 112. It should be noted that the anneal to form source/drain regions 104 may be part of the sidewall spacer 130 formation or the anneal to form the deeper source/drain regions 132 instead of being a separate anneal.

The above mentioned sidewall spacer 130 has several other uses that may be utilized alone or in addition to that described above. For example, the sidewall spacer 130 can be formed prior to the doping of raised source/drain region 106. Sidewall spacers 130 will then prevent the implantation of dopant into the facets of raised source/drain regions 106. Sidewall spacers 130 can also be used in a process for cladding the raised source/drain regions 106, thereby preventing the cladding in a selected portion of the raised source/drain regions 106. This selected portion may include some, all or more of regions 106 than simply the faceted area. Cladding of the raised source/drain regions 106 can be accomplished using methods similar to those described above with reference to cladding the gate electrode 112. Cladding of the raised source/drain regions 104 should not, however, occur over the entire region 106. Cladding at the ends of the faceted regions should be avoided since a gate dielectric is desired at that region and a thermally grown gate dielectric would not form over a cladded region.

A raised source/drain MOSFET 200 formed according to a second embodiment of the invention is shown in FIG. 7. MOSFET 200 is formed in substrate 202 and comprises ultra-shallow source/drain junction regions 204 below raised source/drain regions 206. Raised source/drain regions 206 are, for example, doped epitaxial silicon. However, other materials such as other semiconductors, metal, and/or silicides may alternatively be used. Channel doping is substantially limited to the immediate channel region 208. This reduces the source/drain junction capacitance over the traditional methods of (a) implanting the entire active area for the channel implant including the source/drain junction regions, or (b) using non-self-aligned but more localized channel implant.

A gate dielectric 210 separates the gate electrode 212 from the channel region 208. Gate dielectric 210 may comprises any appropriate material. Conventionally, a thermally grown oxide, oxynitride, or deposited gate insulator is used. A sidewall dielectric 215 separates gate electrode 212 from raised source/drain regions 206. The sidewall dielectric 215 thickness is less than 200 Å for deep sub-micron devices. Sidewall dielectric 215 may, for example, comprise nitride. Gate electrode 212 preferably comprises a low resistance material such as metal or doped polysilicon. However, other conductive materials, such as amorphous silicon, a non-crystalline silicon, a composite metal-polysilicon or metal-metal, may alternatively be used. Examples include aluminum over titanium-nitride and tungsten over titanium nitride. Gate electrode 112 is also preferably salicided to further reduce sheet resistance if polysilicon is used. If desired, gate electrode 212 may be formed into a T-gate structure as shown in FIG. 4. A T-gate structure is not required to practice the invention, but offers further reduction in gate sheet resistance.

A dielectric layer 214 separates the raised source/drain regions 206 from the overlying portions of the T-gate structure 212. The material of dielectric layer 214 is chosen such that a disposable gate material used during processing may be etched selectively with respect to dielectric layer 214. This will be described further below. For example, dielectric layer 214 may comprise an oxide. The thickness of dielectric layer 214 may be tailored to allow for a low gate-to-drain capacitance between the raised source/drain regions 206 and the overlying portion of the T-gate structure 212.

A method for forming MOSFET 200 according to the second embodiment of the invention will now be described in conjunction with FIGS. 8A–8G. Referring to FIG. 8A, a disposable gate 220 is formed on an active area of substrate 202 over the region where the channel region of MOSFET 200 is to be located. Disposable gate 220 comprises at least two separate materials. As shown in FIG. 8A, three material layers are used. The first, 222, may comprise an oxide or other material that may be selectively removed from substrate 202 without substantially etching into substrate 202. The second, 223, is a material that may be etched selectively with respect to the first material layer 222 and several subsequently formed layers as will be discussed below. For example, second material layer may comprise silicon-germanium or silicon. If desired, first material layer 222 may be omitted and the second material layer 223 placed directly on substrate 202. This is provided the second material layer 223 can be selectively removed from substrate 202 without etching into the channel region. Silicon-germanium may be removed selectively from substrate 202 without etching into the channel region. The third material layer 224 is chosen such that it can be removed without significantly removing the subsequently formed sidewall dielectric. For example, the third material layer 224 may be oxide or nitride of appropriate thickness.

As an alternative, first material 222 may extend over the entire device at this point instead of just being part of the disposable gate. Then, as part of the sidewall dielectric 215 formation described below, the portions of first material 222 not covered by sidewall dielectric 215 and second material 223 may be removed.

Next, a sidewall dielectric 215 is formed on the sidewalls of disposable gate 220, as shown in FIG. 8B. Sidewall dielectric 215 is thin and may, for example be less than 200 Å for deep sub-micron devices. The material of sidewall dielectric 215 is chosen such that the disposable gate 220 may be selectively removed without substantially removing sidewall dielectric 215 and/or without substantially removing sidewall dielectric 215 nearby source/drain junction regions 204. For example, if disposable gate 220 comprises the materials of oxide and silicon-germanium or silicon, sidewall dielectric 215 may comprise nitride or an oxide/nitride composite. Other combinations of materials and thicknesses will be apparent to those of ordinary skill in the art.

Raised source/drain regions 206 and source/drain regions 204 may be formed in a variety of ways as discussed above relative to the first embodiment and its modifications. The remaining figures and discussion assume source/drain junction regions 204 are outdiffused from raised source/drain regions 206, as shown in FIG. 8C. Although not shown, the structure of FIG. 8C may include optional shallow junction extender regions, such as those shown in FIG. 1 region 22 or FIG. 6. region 104. This optional shallow junction formation may be performed prior to or after the formation of raised source/drain regions 206. Although not shown, this optional implant is also applicable to the first embodiment described above. Note: as an option to the preferred embodiment, after raised source/drain regions are formed, sidewall dielectric 215 or a portion of sidewall dielectric 215 comprising nitride may be selectively removed.

Next, a dielectric layer 214 is deposited over the structure. Dielectric layer 214 is then planarized back (e.g., CMP or etchback) until the top of second material 223 is exposed. Alternatively, a patterned etch of dielectric layer 214 in the proximity of disposable gate 220 may be utilized. Thus, the material of dielectric layer 214 is chosen such that it can be selectively removed with respect to the second material 223 and/or with respect to the third material. For example, dielectric layer 214 may comprise an oxide. The layer of third material 224 may be removed during this planarization process, as shown in FIG. 8D. Alternatively, the layer of third material 224 may be removed after planarization by etching using an etch that does not significantly remove dielectric layer 214.

Referring to FIG. 8E, the layer of second material 223 is then selectively removed. Dielectric layer 214 and sidewall dielectric 215 are not substantially removed by the etch because they are different materials chosen such that the layer of second material 223 could be selectively removed. It should be noted that if first material 222 comprises the same material as second material 223, first material 222 will also be removed. This is not a problem as long as the material chosen may be removed with a high selectivity to silicon so that the substrate 202 in the channel region 208 is not etched into. Silicon-germanium is an example of a material that may be removed with a high selectivity to silicon.

Next, a self-aligned introduction of channel dopants (e.g., by implantation or gas immersion laser doping) may be performed. The introduction of channel dopants may be performed prior to or after the removal of first material 222. Because dielectric layer 214 covers raised source/drain regions 206, the introduction of channel dopants is substantially limited to only the immediate channel 208 area. The introduction of channel dopants is self-aligned to the raised source/drain regions 206. This causes a reduction in the capacitance of the subsequently formed source/drain junction region over prior art methods in which the channel implant is not self-aligned to the channel but extends into the source/drain junction regions as well.

At this point, a variation of the preferred embodiment can be utilized so as to remove the dielectric sidewall 215. Dielectric sidewall 215 may be removed by selective etching prior to formation of the gate dielectric 210.

Next, a gate dielectric 210 is formed followed by the deposition of gate material 226, as shown in FIG. 8F. Gate dielectric 210 may comprise a grown and/or deposited oxide, oxynitride, or any other suitable gate dielectric material including materials with higher dielectric constant than silicon dioxide. If gate dielectric 210 is deposited, then it may be nearly conformal along the vertical edges of insulator 214 as well as on top of insulator layer 214 (not shown). The lateral dimension of the gate material 226 adjacent to the gate dielectric 210 is determined by the opening in insulator material 214 left by the removal of the disposable gate. Thus, the actual channel length is not determined by the patterned etch of the gate material 226. In this embodiment, the opening left by the removal of disposable gate 220 may not be such that the gate material 226 extends over the tips of raised source/drain regions 206 within the space left by the removal of disposable gate 220 due to the presence of sidewall dielectric 215. If sidewall dielectric 215 has been removed, then gate material 226 can extend over the tips of raised source/drain regions 206.

Gate material 226 may comprise a non-crystalline material substantially containing silicon or silicon-germanium, a doped polysilicon, a doped amorphous silicon layer, a metal layer, a composite material comprised of different metals or a combination of metal and semiconductor material, or other appropriate conductive material (e.g., materials including tungsten, titanium nitride, aluminum, or copper). Additionally, it is noted that if a semiconductor material is utilized in part for the gate material 226, this semiconductor material can be doped in-situ or doped after deposition by means such as implantation and anneal. Doping can be by introduction of n-type dopants (e.g., phosphorus, arsenic or antimony) for an n-type gate material or by p-type dopants (e.g., boron) for a p-type gate material.

Gate material 226 may then be patterned and etched to form gate electrode 212, as shown in FIG. 8G. By performing the gate processing after source/drain formation, heat treatments required by source/drain formation do not affect the gate dielectric 210 and gate electrode 212. Thus, a doped polysilicon gate electrode can be used with an ultra-thin gate dielectric (i.e., 60 Å or even less than 30 Å) without having dopant diffuse from the doped polysilicon into the gate dielectric and channel region. Alternatively, a gate electrode comprising, in part, a metal can be used because the heat treatments for the source/drain formation have already been performed.

As shown in FIG. 8G, a T-gate structure in which the gate electrode 212 extends over a portion of insulator layer 214 may be used to reduce the gate sheet resistance. In addition, having insulator layer 214 separate the raised source/drain regions 206 from the overlying portions of T-gate structure 212 results in a low gate-to-drain capacitance between raised source/drain regions 206 and the overlying portions of T-gate structure 212. Although it offers some advantages, a T-gate structured gate electrode is not required to practice the invention. The gate electrode 212 may be formed in a variety of ways as discussed above relative to the first embodiment except that gate electrode 212 may not be formed so as to overlie portions of raised source/drain regions 206 and source/drain regions 204 separated only by gate dielectric 210. Sidewall dielectric 215 may prevent gate electrode 212 from being separated from regions 206 only by gate dielectric 210. If sidewall dielectric 215 has been removed, then gate electrode 212 can be separated from regions 206 by only gate dielectric 210.

Processing then continues with the formation of interconnections between MOSFET 200 and other devices (not shown) as is known in the art.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a transistor comprising the steps of:

forming a disposable gate on a defined channel region of a substrate, said disposable gate comprising at least two distinct materials;

forming a source/drain region adjacent said disposable gate;

forming an insulator layer over said source/drain region;

selectively removing one of said at least two distinct materials without substantially removing another of said at least two distinct materials;

removing a remainder of said disposable gate;

forming a gate dielectric over said defined channel region after removing said remainder of said disposable gate;

forming a gate electrode over said gate dielectric and a portion of said insulator layer, wherein said forming the gate electrode step comprises the steps of:

depositing at least one conductive material over said gate dielectric and said insulator layer;

removing a portion of said at least one conductive material so that said at least one conductive material is planarized with said insulator layer; and forming a top conductive material over said at least one conductive material and a portion of the insulator layer.

2. The method of claim 1, wherein the step of forming said gate electrode comprises the steps of:

depositing at least one conductive material over said gate dielectric and said insulator layer; and patterning and etching said at least one conductive material to form said gate electrode that extends over a portion of said insulator layer.

3. The method of claim 1, wherein said step of forming the top conductive material comprises the step of:

growing an epitaxial layer by selective epitaxy on said at least one conductive material, wherein said epitaxial layer extends over a portion of said insulator layer.

4. The method of claim 1, wherein said step of forming the top conductive material comprises the step of:

depositing, patterning and etching the top conductive material so that the top conductive material extends over said at least one conductive material and a portion of said insulator layer.

5. The method of claim 1, further comprising the step of cladding said gate electrode.

6. The method of claim 1, wherein said step of forming a source/drain region comprises the step of forming a raised source/drain region.

7. The method of claim 6, wherein the step of forming a source/drain region further comprises the step of diffusing dopant from said raised source/drain region into said substrate.

8. The method of claim 6, wherein the step of forming a source/drain region further comprises the step of cladding said raised source/drain regions prior to said step of forming said gate dielectric.

9. The method of claim 1, further comprising the step of performing a self-aligned introduction of channel dopants after said step of forming said source/drain region and prior to said step of forming a gate dielectric.

10. The method of claim 1, wherein said one of said at least two distinct materials comprises a nitride, another of said at least two distinct materials comprises an oxide.

11. The method of claim 1, wherein said one of said at least two distinct materials comprises a oxide, another of said at least two distinct materials comprises silicon-germanium or silicon, and said insulator layer comprises an oxide.

12. A method of forming a MOSFET comprising the steps of:

forming a disposable gate structure over a defined channel region of a substrate;

forming a raised source/drain region by selective epitaxy adjacent said disposable gate structure, using said disposable gate structure as a mask;

forming a dielectric layer over said raised source/drain region and said disposable gate structure;

removing a portion of said dielectric layer to expose said disposable gate structure;

removing said disposable gate structure;

forming a gate dielectric over said defined channel region;

forming a gate electrode over said gate dielectric.

13. The method of claim 12, wherein said raised source/drain region is insitu-doped.

14. The method of claim 12, further comprising the step of diffusing a dopant from said raised source/drain region into said substrate.

15. The method of claim 12, further comprising the step of cladding said raised source/drain region prior to said step of forming said gate dielectric.

16. The method of claim 12, further comprising the step of performing a self-aligned introduction of channel dopants into said defined channel region after said step of forming said raised source/drain regions and prior to said step of forming a gate dielectric.

17. The method of claim 12, wherein said gate electrode extends over a portion of said dielectric layer.

18. The method of claim 12, wherein said gate electrode comprises a doped non-crystalline material comprised substantially of silicon.

19. The method of claim 12, wherein said gate electrode is cladded.

20. The method of claim 12, wherein said gate electrode comprises a metal layer and a doped polysilicon layer.

21. The method of claim 12, wherein said gate electrode comprises a metal layer and a titanium nitride layer.

22. The method of claim 12, wherein said gate electrode extends over a portion of said raised source/drain region, said gate electrode separated from said portion of the raised source/drain region only by said gate dielectric.

23. The method of claim 12, wherein said raised source/drain region comprises a material selected from the group consisting of a semiconductor, a metal, and a silicide.

24. A method of forming a MOSFET comprising the steps of:

forming a disposable gate over a defined channel region in a substrate;

forming a source/drain region adjacent said disposable gate, wherein said source/drain region is a raised source/drain region formed by selective epitaxy;

forming a dielectric layer over said source/drain region;

removing a portion of said dielectric layer to expose said disposable gate;

removing said disposable gate;

forming a thin gate dielectric having a thickness less than 30 Å over at least a portion of said defined channel region;

forming a gate electrode over said thin gate dielectric, wherein said gate electrode comprises a doped non-crystalline material comprising silicon.

25. The method of claim 24, wherein said disposable gate comprises at least two distinct materials.

26. The method of claim 24, wherein at least one of said at least two materials is removed without substantially removing said dielectric layer.

27. The method of claim 24, wherein said raised source/drain region is insitu doped.

28. The method of claim 24, wherein said step of forming said source/drain region further comprises the step of diffusing dopant from said raised source/drain region into said substrate.

29. The method of claim 24, further comprising the step of siliciding said source/drain region prior to said step of forming said thin gate dielectric.

30. The method of claim 24, further comprising the step of siliciding said gate electrode.

31. The method of claim 24, further comprising the step of performing a self-aligned introduction of channel dopants into said defined channel region after said step of forming said source/drain region.

32. The method of claim 24, wherein said gate electrode extends over a portion of said raised source/drain region, said gate electrode separated from said portion of the raised source/drain region only by said gate dielectric.

* * * * *